US012777899B2

(12) United States Patent
Chen et al.

(10) Patent No.: US 12,777,899 B2
(45) Date of Patent: Oct. 27, 2026

(54) SELECTIVE DEPOSITION OF PASSIVATING LAYER DURING SPACER ETCHING

(71) Applicant: Tokyo Electron Limited, Tokyo (JP)

(72) Inventors: Ya-Ming Chen, Austin, TX (US); Eric Chih-Fang Liu, Albany, NY (US); Shihsheng Chang, Albany, NY (US); Peter Biolsi, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 731 days.

(21) Appl. No.: 18/160,779

(22) Filed: Jan. 27, 2023

(65) Prior Publication Data

US 2024/0258108 A1 Aug. 1, 2024

(51) Int. Cl.

| | |
|---|---|
| ***H10P 76/40*** | (2026.01) |
| ***G03F 7/00*** | (2006.01) |
| ***H01J 37/32*** | (2006.01) |
| ***H10P 50/28*** | (2026.01) |
| ***H10P 76/20*** | (2026.01) |

(52) U.S. Cl.

CPC ...... *H10P 76/4085* (2026.01); *G03F 7/70033* (2013.01); *H01J 37/32449* (2013.01); *H10P 76/2043* (2026.01); *H01J 37/32082* (2013.01); *H01J 2237/3341* (2013.01); *H10P 50/283* (2026.01); *H10P 50/285* (2026.01); *H10P 50/287* (2026.01); *H10P 76/405* (2026.01)

(58) Field of Classification Search

CPC .. H10P 76/4085; H10P 50/283; H10P 50/285; H10P 50/287; H10P 76/405; H10P 76/2043; H10P 50/73; G03F 7/70033; H01J 37/32449; H01J 37/32082; H01J 2237/3341

See application file for complete search history.

(56) References Cited

U.S. PATENT DOCUMENTS

| | | | | |
|---|---|---|---|---|
| 9,287,134 | B2 | 3/2016 | Wang et al. | |
| 11,276,560 | B2 | 3/2022 | Sung et al. | |
| 2019/0390341 | A1* | 12/2019 | Singhal | H10P 14/6339 |
| 2021/0407804 | A1* | 12/2021 | Ko | H10P 76/4085 |
| 2022/0102153 | A1* | 3/2022 | Sieg | H10P 50/695 |

* cited by examiner

*Primary Examiner* — William B Partridge
*Assistant Examiner* — Chevy J Boegel
(74) *Attorney, Agent, or Firm* — Slater Matsil, LLP

(57) ABSTRACT

A method for processing a substrate includes: forming a mandrel over the substrate including an underlying layer, the mandrel having a top surface and sidewalls, the substrate including an exposed surface including a portion of the underlying layer; conformally depositing a spacer material over the substrate, the spacer material covering the top surface and the sidewalls of the mandrel and the portion of the underlying layer; in a plasma processing chamber, exposing the substrate to a plasma generated in the plasma processing chamber from a first halogen-containing process gas, a second halogen-containing process gas, and a carbon-containing passivating agent, the exposing anisotropically etching the spacer material; and removing the mandrel to form free-standing spacers from sidewall portions of the spacer material covering the sidewalls of the mandrel.

20 Claims, 7 Drawing Sheets

SELECTIVE DEPOSITION OF PASSIVATING LAYER DURING SPACER ETCHING

TECHNICAL FIELD

The present invention relates generally to methods of processing a substrate, and, in particular embodiments, to selective deposition of passivating layer during spacer etching.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Process flows used to form the constituent structures of semiconductor devices often involve depositing and removing a variety of materials while a pattern of several materials may be exposed in a surface of the working substrate.

The minimum dimension of features in a patterned layer is shrunk periodically to roughly double the component density at each successive technology node, thereby reducing the cost per function. Innovations in patterning, such as immersion deep ultraviolet (i-DUV) lithography, multiple patterning, and 13.5 nm wavelength extreme ultraviolet (EUV) optical systems have brought some critical dimensions down close to ten nanometers. This squeezes the margin for pattern misalignment and puts pressure on process integration to provide self-aligned structures to prevent electrical opens and shorts in middle-of-line (MOL) and back-end-of-line (BEOL) interconnect elements. Innovative process flows for fabricating self-aligned structures may rely on availing highly selective etch and deposition processing techniques, thereby challenging semiconductor processing technology such as plasma enhanced deposition and etching to innovate and provide the requisite unit processes with the nanoscale precision, uniformity, and repeatability that IC manufacturing demands.

SUMMARY

In accordance with a preferred embodiment of the present invention, a method for processing a substrate includes: forming a mandrel over the substrate including an underlying layer, the mandrel having a top surface and sidewalls, the substrate including an exposed surface including a portion of the underlying layer; conformally depositing a spacer material over the substrate, the spacer material covering the top surface and the sidewalls of the mandrel and the portion of the underlying layer; in a plasma processing chamber, exposing the substrate to a plasma generated in the plasma processing chamber from a first halogen-containing process gas, a second halogen-containing process gas, and a carbon-containing passivating agent, the exposing anisotropically etching the spacer material; and removing the mandrel to form free-standing spacers from sidewall portions of the spacer material covering the sidewalls of the mandrel.

In accordance with a preferred embodiment of the present invention, a method of self-aligned multiple patterning includes: forming a to-be-patterned layer over a substrate; depositing a mandrel material over the to-be-patterned layer; patterning the mandrel material to form a mandrel; performing an atomic layer deposition (ALD) to conformally deposit a spacer material over the substrate, the spacer material covering a top surface and sidewalls of the mandrel and a portion of to-be-patterned layer; in a plasma etch chamber without a remote plasma source, flowing a process gas, the process gas including a halogen-containing gas and a hydrocarbon, a flow rate ratio of the halogen-containing gas and the hydrocarbon being between 3:2 and 10:1; in the plasma etch chamber, sustaining a plasma generated from the process gas; exposing the substrate to the plasma to anisotropically etch the spacer material, where a polymeric layer including carbon is selectively deposited over the top surface of the mandrel, the polymeric layer protecting the mandrel from etching, a portion of the spacer material remaining on the sidewalls of the mandrel; in the plasma etch chamber, removing the mandrel to form free-standing spacers; and using the free-standing spacers as an etch mask, patterning the to-be-patterned layer to form a feature.

In accordance with a preferred embodiment of the present invention, a method of self-aligned multiple patterning includes: performing an extreme ultraviolet (EUV) lithographic process to pattern a photoresist layer formed over a layer stack including a mandrel layer, a dielectric layer, and an anti-reflective coating (ARC) layer over a substrate, the substrate further including, below the mandrel layer, an underlying layer; performing a pattern transfer etch to etch through the dielectric layer and the ARC layer and patterning the mandrel layer, a portion of the underlying layer becoming exposed; depositing a spacer material over the patterned mandrel layer and the portion of the underlying layer; removing a first portion of the deposited spacer material that covers top surfaces of the patterned mandrel layer; depositing a polymeric layer over the top surfaces of the patterned mandrel layer; removing a second portion of the deposited spacer material that covers the portion of the underlying layer; removing the patterned mandrel layer and the polymeric layer to form free-standing sidewall spacers; and forming a recess in the underlying layer by etching the underlying layer using the free-standing sidewall spacers as an etch mask.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1G illustrate cross-sectional views of an example substrate during a self-aligned double patterning (SADP) process with mandrel passivation, at various stages of processing in accordance with various embodiments, wherein FIG. 1A illustrates an incoming substrate, FIG. 1B illustrates the substrate after forming mandrels, FIG. 1C illustrates the substrate after depositing a spacer material over the mandrels, FIG. 1D illustrates the substrate after a spacer etch with mandrel passivation, FIG. 1E illustrates the substrate after a mandrel pull etch, FIG. 1F illustrates the substrate after a first pattern transfer etch, and FIG. 1G illustrates the substrate after a final pattern transfer etch;

FIGS. 3A-3C illustrate process flow charts of methods of SADP process with mandrel passivation in accordance with various embodiments, wherein FIG. 3A illustrates an embodiment, FIG. 3B illustrates another embodiment, and FIG. 3C illustrates yet another embodiment.

DETAILED DESCRIPTION OF ILLUSTRATIVE EMBODIMENTS

Figure 1A:
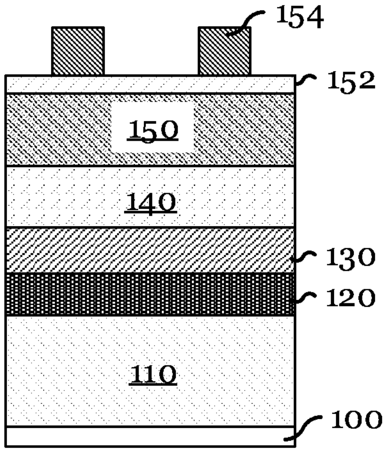

This application relates to methods of processing a substrate, more particularly to the improvement of a spacer etch process during a self-aligned multi-patterning process through selective deposition of a passivating layer over mandrels. As the semiconductor technology node continues to shrink, the requirement for precise placement of features (e.g., metal lines, contacts, and vias) becomes increasingly more stringent. Various multiple patterning techniques such as self-aligned double patterning (SADP) enable fabrication at small scales, even below the resolution limit of photolithography, by utilizing spacer formation on the sidewalls of the first feature defined by photolithography (e.g., mandrel). A typical SADP process flow comprises deposition of a spacer material over a mandrel pattern, followed by a spacer etch. The spacer etch anisotropically removes the lateral portion of the spacer material such that the remaining spacer material only covers the sidewalls of the mandrels. Subsequently, a mandrel etch can remove the mandrels to form free-standing sidewall spacers. Patterns are doubled because two free-standing sidewall spacers are formed for each mandrel resulting in the formation of features much smaller than the mandrel. However, a typical SADP process may have etch selectivity issues. For example, during the spacer etch, the mandrel may severely be damaged due to poor etch selectivity, often leading to thinning of the sidewall spacers and pattern irregularity or collapse. Final features formed thereafter may thus suffer from pitch walking, critical dimension (CD) variations, high line edge roughness (LER), and high recess depth variation among others. Therefore, methods of improving spacer etch for SADP process may be desired. Embodiments of the present application disclose a plasma etch process to etch spacer materials used for SADP process with improved etch selectivity through selective deposition of a passivating layer over the mandrels.

The methods of plasma etch process described in this disclosure may improve the etch selectivity of a spacer etch, eliminating or minimizing damage to the mandrel. In various embodiments, a continuous, fast plasma etch process (e.g., <60 s) may be employed and sufficiently etch the spacer material during a SADP process. The addition of a passivating agent during the plasma etch process enables the selective formation of the passivating layer over the mandrel. Further, the inventors of this application have demonstrated that the addition of the passivating agent does not negatively impact the etch rate of the spacer material. The methods may advantageously be applied to a high-density plasma processing system without the need of a remote plasma source. Accordingly, the methods may improve various self-aligned multiple patterning techniques, in particular in connection with fabricating small features using extreme ultraviolet (EUV) photolithography.

In the following, the methods of a SADP process with mandrel passivation during a spacer etch in accordance with various embodiments are described referring to FIGS. 1A-1G. Exemplary experimental data are presented in FIG. 2 to illustrate the effect of a passivating agent in a process gas on mandrel passivation. Example process flow diagrams are illustrated in FIG. 3A-3C. All figures in this disclosure are drawn for illustration purpose only and not to scale, including the aspect ratios of features. Although the description below in this disclosure is described mainly for a SADP process, the methods herein may also be applied to any multiple patterning techniques, including self-aligned quadruple patterning (SAQP).

FIGS. 1A-1G illustrate cross-sectional views of an example substrate during a self-aligned double patterning (SADP) process with mandrel passivation, at various stages of processing in accordance with various embodiments. FIG. 1A illustrates a cross-sectional view of the incoming substrate 100.

In FIG. 1A, the substrate 100 may be a part of, or includes, a semiconductor device, and may have undergone a number of steps of processing following, for example, a conventional process. The substrate 100 accordingly may comprise layers of semiconductors useful in various microelectronics. For example, the semiconductor structure may comprise the substrate 100 in which various device regions are formed.

In one or more embodiments, the substrate 100 may be a silicon wafer, or a silicon-on-insulator (SOI) wafer. In certain embodiments, the substrate 100 may comprise a silicon germanium wafer, silicon carbide wafer, gallium arsenide wafer, gallium nitride wafer and other compound semiconductors. In other embodiments, the substrate 100 comprises heterogeneous layers such as silicon germanium on silicon, gallium nitride on silicon, silicon carbon on silicon, as well layers of silicon on a silicon or SOI substrate. In various embodiments, the substrate 100 is patterned or embedded in other components of the semiconductor device.

As illustrated in FIG. 1A, the substrate 100 may comprise an underlying layer 110 over the substrate 100. In various embodiments, the underlying layer 110 is a target layer that is to be patterned for semiconductor device fabrication. In certain embodiments, the feature being etched into the underlying layer 110 may be a contact hole, slit, or other suitable structures comprising a recess. The underlying layer 110 may comprise an oxide, amorphous silicon, polysilicon, or other dielectric materials useful in semiconductor fabrication. The underlying layer 110 may comprise a low-k dielectric material in some example, and may be a porous material. In one embodiment, the underlying layer 110 may be a silicon oxide layer. In another embodiment, the underlying layer 110 may comprise a silicon oxide prepared by plasma-enhanced CVD or flowable CVD using tetraethyl orthosilicate (TEOS) as a precursor. The underlying layer 110 may be deposited using an appropriate technique such as vapor deposition including chemical vapor deposition (CVD), physical vapor deposition (PVD), atomic layer deposition (ALD), as well as other plasma processes such as plasma enhanced CVD (PECVD) and other processes. In one embodiment, the material layer 110 has a thickness between 5 nm to 10 μm.

Over the underlying layer 110, an adhesion layer 120 may be formed in order to facilitate the subsequent deposition of a hardmask layer 130. In various embodiments, the adhesion layer 120 may comprise an oxide or other materials such as silicon carbon nitride (SiCN). The adhesion layer 120 may be deposited using an appropriate technique such as vapor deposition as described above for the underlying layer 110.

In various embodiments, the hardmask layer 130 may be a metal-based hardmask layer. In certain embodiments, the hardmask layer 130 may comprise nitride, oxide, oxynitride, carbide, or other dielectric materials. In one or more embodiments, the hardmask layer 130 may comprise silicon nitride, titanium nitride, titanium, tantalum, tantalum nitride, tungsten based compounds, ruthenium based compounds, molybdenum based compounds, or aluminum based compounds. The hardmask layer 130 may be deposited using suitable deposition techniques such as vapor deposition including chemical vapor deposition (CVD), physical vapor deposition (PVD), as well as other plasma processes such as plasma enhanced CVD (PECVD), sputtering, and other processes including wet processes. The hardmask layer 130 may have a thickness of about 5 nm to about 50 nm in various embodiments.

Although a single layer of hardmask is illustrated in FIG. 1A, in other embodiments, a layer stack of hardmask comprising multiple materials (e.g., layers of oxide and nitride) may be used for improved profile fidelity during various patterning stages.

Over the hardmask layer 130, additional layers for forming an initial pattern by photolithography may be deposited. In various embodiments, the additional layers may comprise a mandrel layer 140, a spin on carbon (SOC) layer 150, an anti-reflective coating film (ARC) 152 such as silicon-containing ARC (SiARC), and a photoresist 154. The layers illustrated in FIG. 1A are for example only, and in other embodiments, the additional layers may include other layers or consist of fewer layers.

In one or more embodiments, the mandrel layer 140 comprises amorphous silicon, or any other type of sacrificial material known within the art. The mandrel layer 140 may also compromise a plasma polymerized organic film, spin on film or dielectric film. The mandrel layer 140 may have a desired height and width. In various embodiments, the ratio of the height to the width of the mandrel layer 140 (i.e., the aspect ratio) is between 2:1 to 20:1. In various embodiments, the mandrel layer 140 may have a height of about 10 nm to 1 μm, and in one embodiment about 40 nm to about 50 nm.

The initial pattern of the photoresist 154 may be generated by a conventional photolithographic process by exposing the substrate 100 to a UV radiation through a photomask and developing the photoresist 154. In certain embodiments, extreme ultraviolet (EUV) lithography may be used to pattern the photoresist 154, but in other embodiments, any other suitable lithographic technique may be used. In various embodiments, the initial pattern may be a line pattern, but any suitable pattern shape may be possible.

Figure 1B:
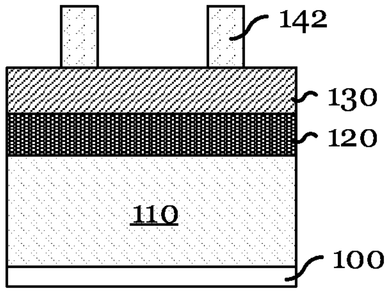

FIG. 1B illustrates a cross-sectional view of the substrate 100 after forming mandrels 142.

In FIG. 1B, the initial pattern of the photoresist 154 may be transferred into the mandrel layer 140 (e.g., FIG. 1A) to form the mandrels 142 by an etch process such as reactive ion etch (RIE). With forming the mandrels 142, the exposed surface may comprise top surfaces and sidewalls of the mandrels 142, as well as a portion of a layer immediately below the mandrels 142 (e.g., the hardmask layer 130 in FIG. 1). In various embodiments, the critical dimensions (CD) of the mandrels 142 may be smaller than those of the photoresist 154 (e.g., FIG. 1A) through shrinking during the etch process. The target CD of the mandrels 142 may be selected in consideration of the quality of spacers to be formed on the sidewalls of the mandrels 142. In one or more embodiments, the mandrels 142 may have the CD of 80 nm or less. In one embodiment, the mandrels 142 may be formed with a pitch size of 160 nm or less.

Figure 1C:
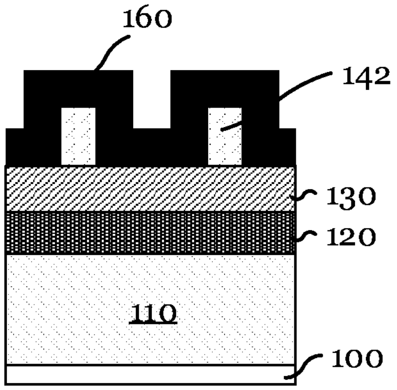

FIG. 1C illustrates a cross-sectional view of the substrate 100 after depositing a spacer material 160 over the mandrels 142.

In FIGS. 1C, a layer of the spacer material 160 is conformally deposited over the substrate 100. As illustrated in FIG. 1C, the top surfaces and sidewalls of the mandrels 142 as well as the previously exposed portion of the hardmask layer 130 may be covered with the spacer material 160. To ensure the coverage of the sidewalls of the mandrels 142, in various embodiments, the spacer material 160 may be deposited using a conformal deposition process such as atomic layer deposition (ALD) or any other technique used within semiconductor device fabrication. The spacer material 160 may comprise silicon oxide, silicon nitride, titanium nitride, titanium oxide, or any other type of oxide or insulating material known within the art. Appropriate materials for various layers (e.g., the hardmask layer 130, the mandrel layer 140, and the spacer material 160) may be selected in consideration of respective etch selectivity and cost of fabrication. In one embodiments, the hardmask layer 130 may both comprise silicon nitride, and the spacer material 160 may comprise silicon oxide or metal oxide in order to utilize the etch selectivity between oxide and nitride.

In certain embodiments, the thickness and CD of sidewall spacers to be produced from the spacer material 160 may be determined based on the thickness and CD of the mandrels 142 as well as the target final pitch. In one or more embodiments, the thickness of the layer of the spacer material 160 is between about 3 nm to about 40 nm. In one embodiment, the thickness of the layer of the spacer material 160 is approximately equal to the CD of the mandrels 142. Further, to enable the formation of sidewall spacers as described below, the thickness of the layer of the spacer material 160 is less than a half of the gap between the mandrels 142.

Figure 1D:
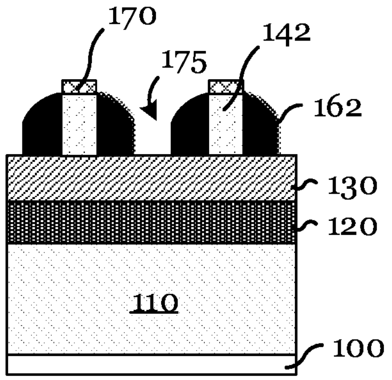

FIG. 1D illustrates a cross-sectional view of the substrate 100 after a spacer etch with mandrel passivation.

In FIGS. 1D, the spacer material 160 is etched by an anisotropic etching process, such as reactive ion etch (RIE). In this spacer etch step, a portion of the spacer material 160 may be removed selectively from the substantially horizontal surfaces, thereby forming sidewall spacers 162 adhering to the near-vertical edges of the mandrels 142. As a result, first recesses 175 are formed as illustrated in FIG. 1C. The spacer etch step must sufficiently remove both a top portion of the spacer material 160 that covered the top surfaces of the mandrels 142 and a bottom portion of the spacer material 160 that covered the portion of the hardmask layer 130, while leaving a sidewall portion of the spacer material 160 to form the sidewall spacers 162.

Generally, the spacer etch may use a plasma etch process based on halogen-based chemistry (e.g., Cl and F). However, insufficient etch selectivity of conventional methods may often lead to significant sidewall loss and damage to the mandrels 142 during the spacer etch. The damage to the mandrels 142 may be difficult to avoid because even after the top portion of the spacer material 160 is completely removed, the spacer etch may need to continue to ensure the bottom separation of the spacer material 160 at the bottom of the first recesses 175. The inventors of this application have identified that this issue is particularly challenging when the mandrels 142 comprises silicon (e.g., amorphous silicon) and the spacer material 160 comprises metal oxide due to poor etch resistance of mandrel materials. On the other hand, it is also impractical to select a highly etch resistant material for mandrel because the mandrel is only a temporary support for sidewall spacer formation and needs to be removed in a subsequent step.

To address this issue of mandrel damage during the spacer etch, the inventors of this application developed a continuous plasma etch process with mandrel passivation. The methods disclosed in this disclosure may use a halogen-based etch chemistry with the addition of a passivating agent that enables the formation of a passivation layer over the exposed mandrel. As illustrated in FIG. 1D, a polymeric layer 170 may be selectively deposited over the exposed top portion of the mandrel 142 during the spacer etch, protecting the mandrel 142 from being etched by the plasma.

In various embodiments, the spacer etch with mandrel passivation may comprise a plasma etch, where the process gas comprises a halogen-containing gas and a passivating agent. For example, dichlorine ($Cl_2$) may be used as a main etchant gas, and the passivating agent may comprise a hydrocarbon (e.g., $CH_4$). In certain embodiments, the process gas may comprise two types of halogen (e.g., Cl and F). In one or more embodiments, the F-containing gas may comprise tetrafluoromethane ($CF_4$), nitrogen trifluoride ($NF_3$), fluoroform ($CHF_3$), difluoromethane ($CH_2F_2$), fluoromethane ($CH_3F$), or sulfur hexafluoride ($SF_6$). In one or more embodiments, generally a fluorocarbon gas ($C_xF_y$) may be used. The use of both Cl and F may be useful in achieving a good balance of etching ability. Although not wishing to be limited by any theory, for example, etching a metal oxide spacer material with $Cl_2$ alone may not be fast enough, but with a F-based etchant alone, it may be too aggressive and the mandrel damage may be inevitable. Accordingly, in one or more embodiments, the process gas may comprise a Cl-containing gas as a main etchant and a F-containing gas and a passivating agent as additives.

Various process parameters for the spacer etch such as gas composition, flow rates, and plasma power settings may be selected in consideration of the balance between the overall etch rate, etch selectivity, and mandrel passivation effect. In various embodiments, the flow rate of the Cl-containing gas may be greater than that of the F-containing gas or that of the passivating agent. In one embodiment, the flow rate of the F-containing gas and that of the passivating agent may be about the same. In certain embodiments, a flow rate ratio of the Cl-containing gas to the F-containing gas being between 5:1 and 20:1. In other embodiments, a flow rate ratio of the Cl-containing gas to the passivating agent being between 3:2 and 10:1. In certain embodiments, the passivating agent accounts for between 5% and 35% of the total process gas by volume. In one embodiment, a flow rate of the passivating agent is between 4% and 40% of a total gas flow flowed to a plasma etch chamber. In various embodiments, a dilute gas (e.g., Ar) may also be flowed to the plasma etch chamber.

The spacer etch with mandrel passivation may advantageously be performed as a one-step, continuous plasma process, where the mandrel passivation does not have to be a separate plasma or non-plasma step. The passivation layer (e.g., the polymeric layer 170 in FIG. 1D) may be formed simultaneously by etching the spacer material 160.

In certain embodiments, each of the gas flow rates may be dynamically adjusted during the spacer etch process to enable further tuning of the degree of the removal rate of the spacer material 160 or the formation of the passivation layer. For example, since the passivation layer is particularly desired over the top surfaces of the mandrels 142, at an initial stage (e.g., ~ a few seconds), the spacer etch may be performed without flowing the passivating agent. After the initial stage, when the top surfaces of the mandrels 142 becomes exposed, the passivating agent flow may be turned on to start the formation of the passivation layer.

In one or more embodiments, the methods may further comprise pulsing the passivating agent during the spacer etch. Pulsing the passivating agent, instead of maintaining a constant gas flow, may enable fine turning the local concentration of the passivating agent in the plasma system.

Further, because the addition of a passivating agent to improve the etch selectivity in various embodiments is possible regardless of plasma system configuration, the methods of spacer etch may also be applied in a high-density plasma (HDP) system. Accordingly, the methods may advantageously be performed without a remote plasma source and thereby eliminate the need for additional equipment modifications. A remote plasma source is often used to generate a plasma remotely from a main chamber processing a substrate and the excited species of the plasma may be transported to the main chamber. The remote plasma source may generally be used as a primary plasma source or a supplementary source in addition to a main plasma source configured to generate a direct plasma within the main chamber. The use of remote plasma for spacer etch may be useful in tuning various plasma parameters to optimize the process (e.g., etch selectivity). However, it has been difficult to realize such a fine tuning in a chamber system with single plasma source configuration. Adequately selecting gas composition and flow rates, the methods in various embodiments may enable spacer etch even in a plasma chamber with only a single plasma source, which may relax the equipment specification requirements.

In one or more embodiments, process conditions for the spacer etch may comprise: source power 0-1200 W; bias power 0-600 W; chamber pressure 10-150 mTorr; temperature 10-70° C. Exemplary gas flow rates may be: Ar (15-1100 sccm); $Cl_2$ (10-800 sccm); $CF_4$ or $NF_3$ (8-100 sccm); and $CH_4$ (10-100 sccm).

In various embodiments, the spacer etch with mandrel passivation may advantageously be a fast process where plasma exposure may be between 1 s and 60 s.

As illustrated in FIG. 1D, the gaps between the mandrels 142 after the spacer etch are narrowed by twice the thickness of the sidewall spacers 162. In various embodiments, the spacer etch may be timed. Alternatively, the spacer etch may be stopped at an optional underlying etch stop layer that may be deposited over the hardmask layer 130.

Figure 1E:
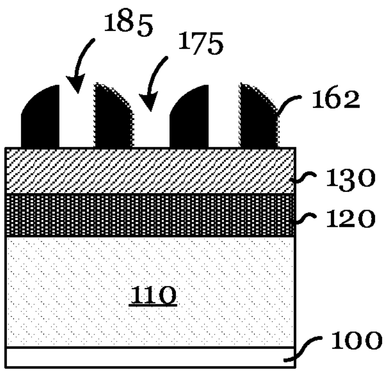

FIG. 1E illustrates a cross-sectional view of the substrate 100 after a mandrel pull etch.

In FIG. 1E, the mandrel pull etch may be performed by an anisotropic plasma etch process, such as reactive ion etch (RIE), to remove the mandrels 142. Alternately, the mandrel pull etch may be performed by a conventional wet etching process. As a result, the sidewall spacers 162 formed in the previous step (FIG. 1D) become free-standing and second recesses 185 are formed. Because two free-standing sidewall spacers can be formed per mandrel separated by the first recesses 175 and the second recesses 185, the feature size initially provided by the photolithography (i.e., the initial pattern of the photoresist 154 in FIG. 1A and that of mandrels 142 in FIG. 1B) has been scaled down by about half.

In various embodiments, the first recesses 175 and the second recesses 185 may comprise a recess having a width between 5 nm to 300 nm. In certain embodiments, the width may be between 8 nm to 40 nm. In further embodiments, the aspect ratio of a recess (i.e., the height-to-width ratio) of the recesses may be between 2:1 to 20:1. In various embodiments, the recesses have critical dimensions required during a back end of line (BEOL) process for a semiconductor device at advanced nodes (e.g., pitch<24 nm). Although the first recesses 175 and the second recesses 185 are illustrated with a single pitch in FIG. 1E, in other embodiments, the recesses may have more than one pitch and/or critical dimensions (CDs).

Further in FIG. 1E, in certain embodiments, the sidewall spacers 162 may have tapered shapes, and thereby each of the sidewall spacers 162 may have a first sidewall and an opposite second sidewall, where the first sidewall has a different height from the second sidewall.

Figure 1F:
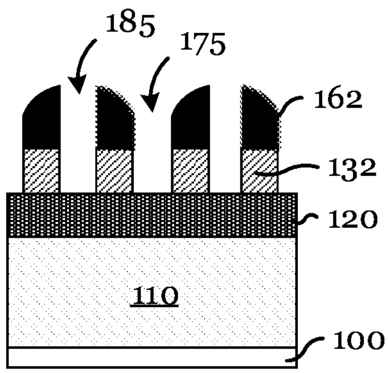

FIG. 1F illustrates a cross-sectional view of the substrate 100 after a first pattern transfer etch.

In FIG. 1F, the first pattern transfer etch may be performed by another anisotropic plasma etch process, such as reactive ion etch (RIE), to etch the hardmask layer 130 selectively to the sidewall spacers 162. A portion of the sidewall spacers 162 may be consumed during the first pattern transfer etch. The recesses (e.g., the first recesses 175 and the second recesses 185 in FIG. 1F) are extended into the hardmask layer 130, resulting in a patterned hardmask 132. Although the adhesion layer 120 remains intact in FIG. 1F and described to be etched in a subsequent step as below, in various embodiments, the first pattern transfer etch may also etch the adhesion layer 120 and expose top surfaces of the underlying layer 110.

Figure 1G:
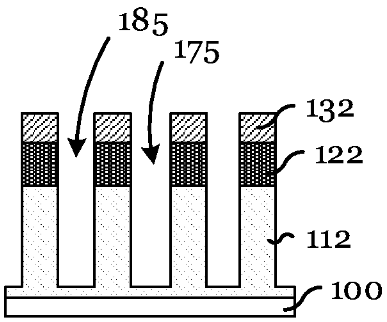

FIG. 1G illustrates a cross-sectional view of the substrate 100 after a final pattern transfer etch.

In FIG. 1G, the final pattern transfer etch may be performed by still another anisotropic plasma etch process, such as reactive ion etch (RIE). At this stage, the patterned hardmask 132 may serve as the etch mask primarily, while etching the adhesion layer 220 and the underlying layer 210. The recesses (e.g., the first recesses 175 and the second recesses 185 in FIG. 1G) may be extended into the underlying layer 210 to form patterned adhesion layer 222 and patterned underlying layer 212.

In various embodiments, the methods of self-aligned double patterning (SADP) described above may improve the fidelity of the final pattern transfer etch as a result of the improved free-standing spacers enabled by mandrel passivation during the spacer etch. In one embodiment, the CD variation in resulting structures may be reduced. Further, other parameters of the recesses may also be improved compared to a conventional SADP process without mandrel passivation. For example, line edge roughness (LER) of the recesses may be improved.

In various embodiments, various subsequent fabrication processes may follow. For example, in a back-end-of-line (BEOL) process, any remaining layers over the patterned underlying layer 212 may be removed and then metallization may be performed to form conductive lines/vias/supervias for a semiconductor device, followed by a planarization process.

Figure 2:
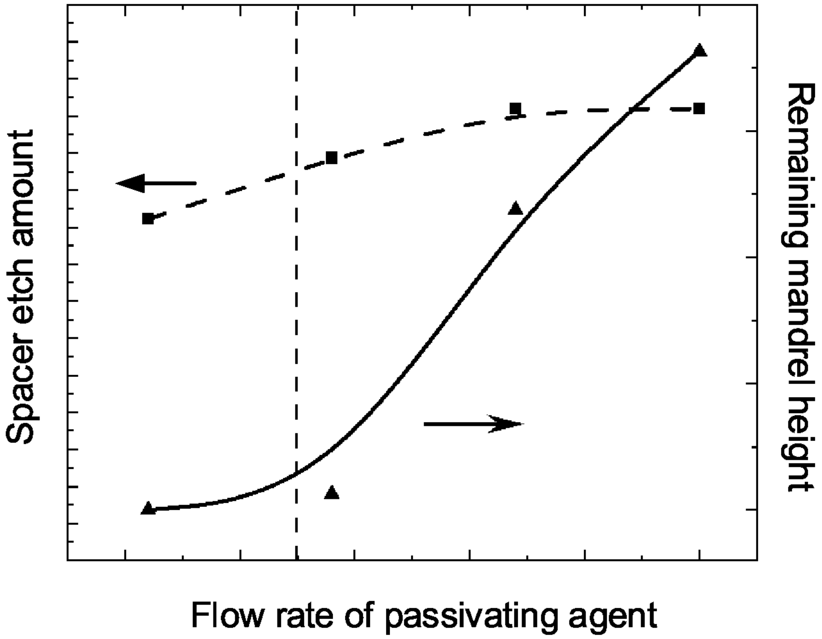
FIG. 2 illustrate the effect of a passivating agent in a process gas during the spacer etch on the spacer etch amount and the remaining mandrel height obtained from an exemplary experiment for a spacer etch in accordance with an embodiment.
Figure 3A:
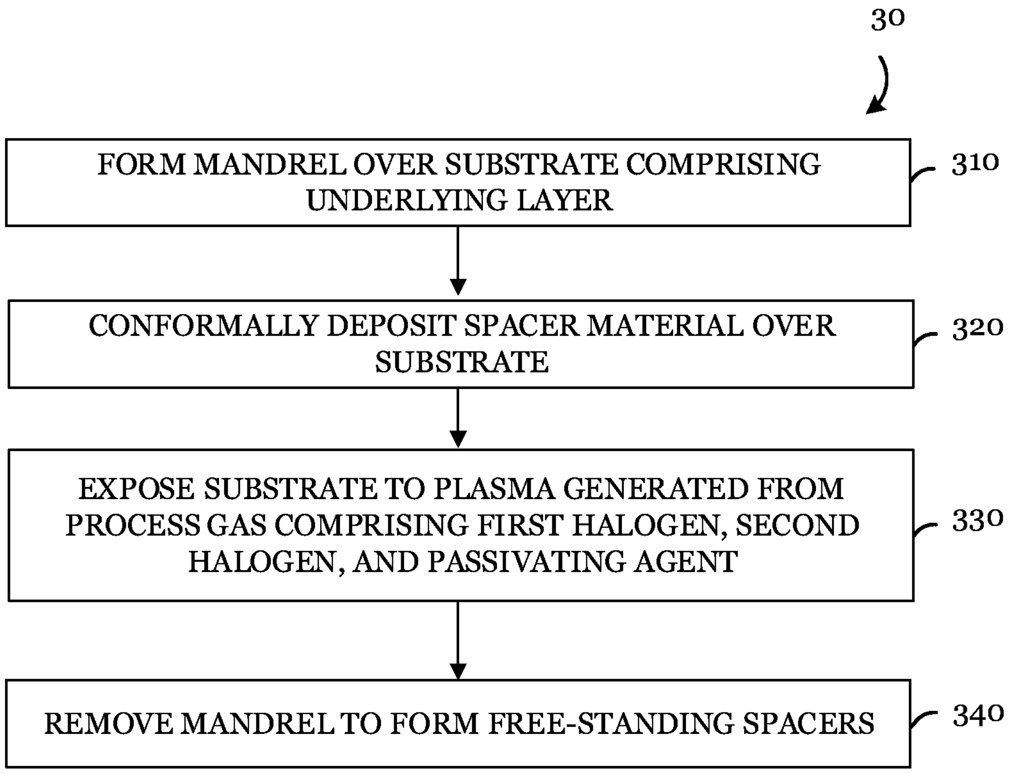
Figure 3B:
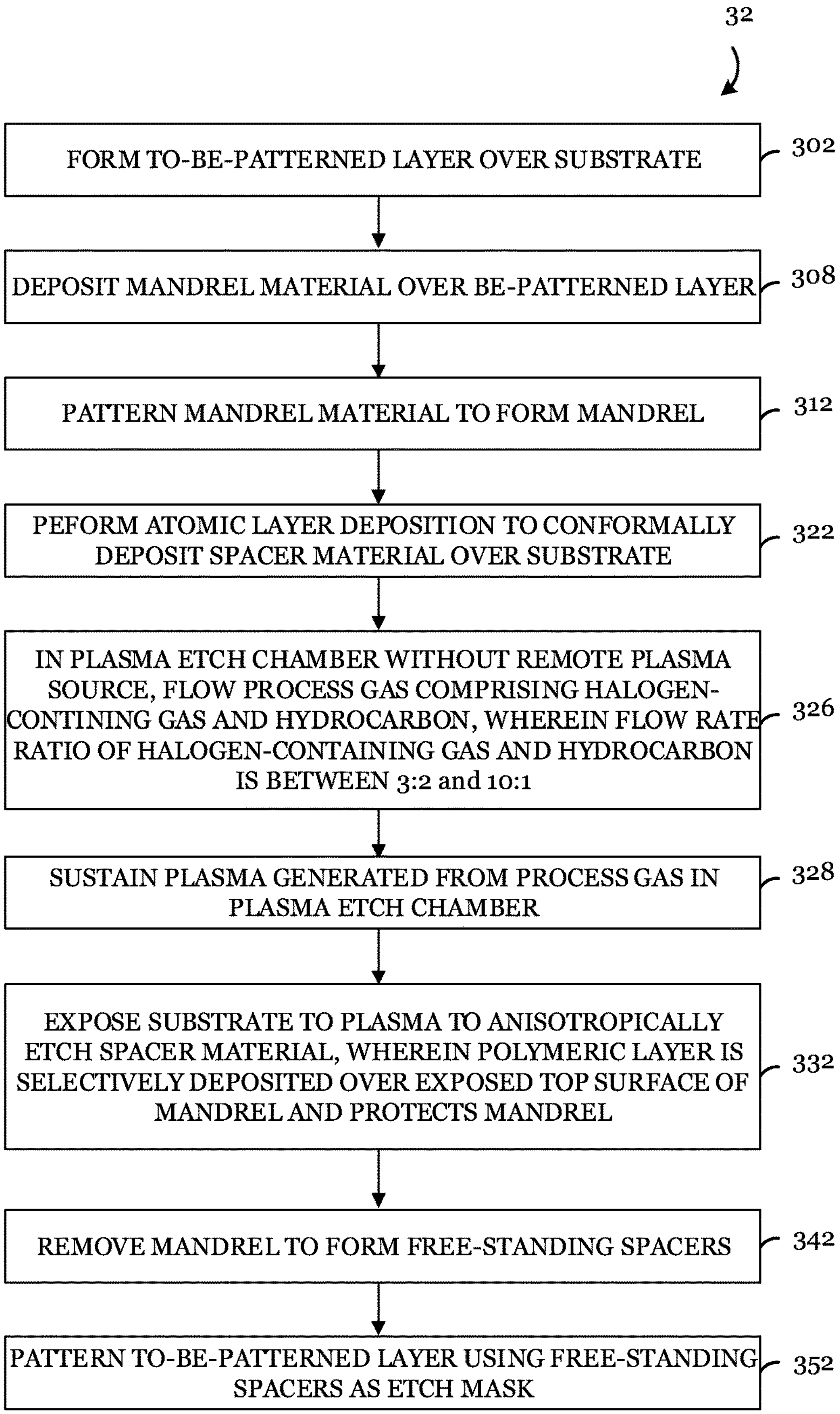
Figure 3C:
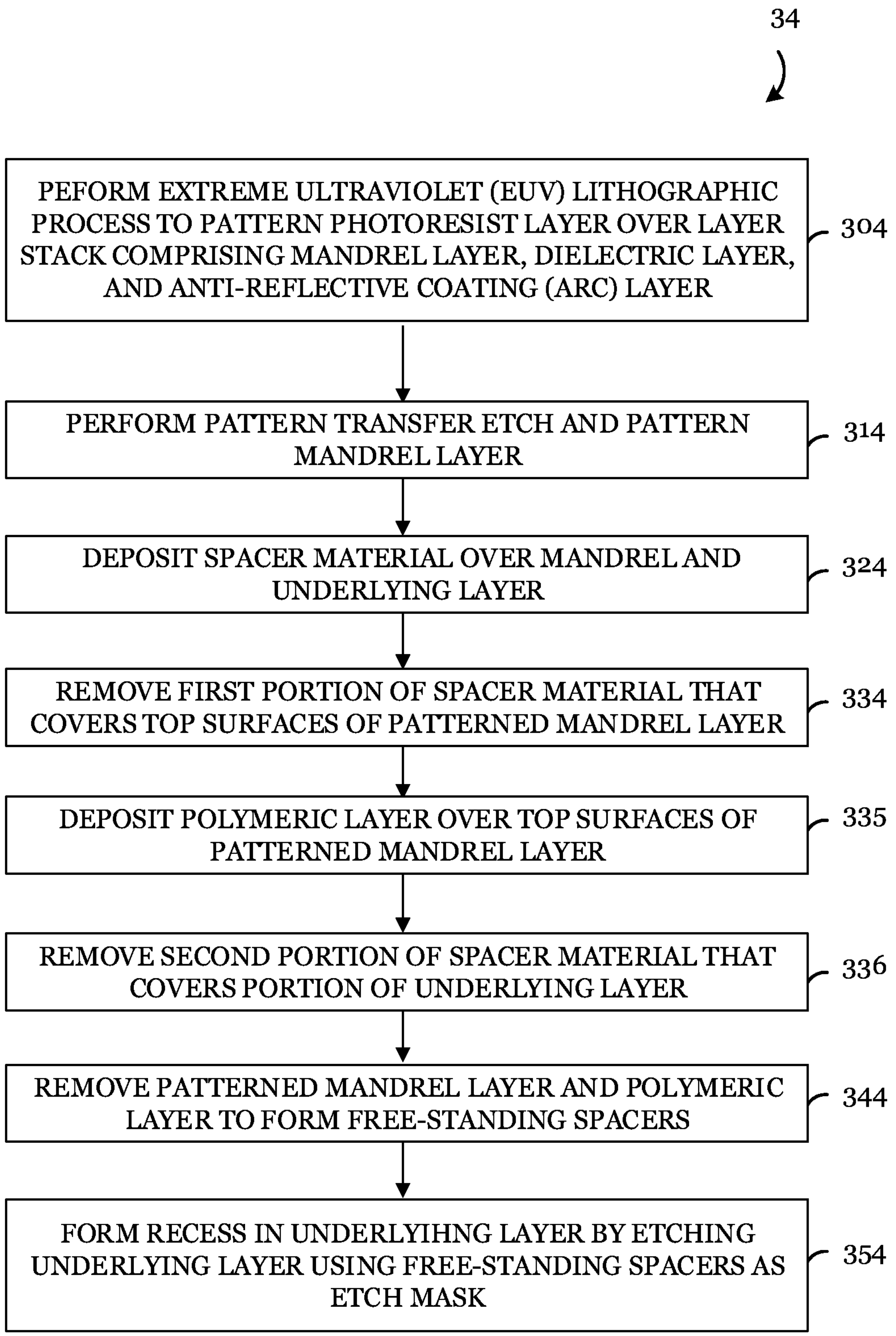

FIG. 2 illustrate the effect of flow rate of a passivating agent in a process gas during the spacer etch on the spacer etch amount and the remaining mandrel height obtained from an exemplary experiment for a spacer etch in accordance with an embodiment.

As described above, various embodiments may improve a spacer etch (e.g., FIG. 1D) as a part of SADP process by including a passivating agent that may prevent mandrel damage. The inventors of this application experimentally demonstrated a significant effect of passivating agent and its flow rate on the mandrel passivation. In the experiments, the addition of $CH_4$ during $Cl_2$-based plasma etch was examined for titanium oxide-based spacers formed over amorphous silicon-based mandrels. In FIG. 2, the amount of spacer material etched from the top portion (a dotted curve) and the remaining height of the mandrel after the etch process (a solid curve) are plotted both as functions of the flow rate of the passivating agent. At the low passivation regime (e.g., $CH_4$ flow rate<25 sccm), a substantial loss of the mandrel is observed and only negligible amount of mandrel remains after the spacer etch. The mandrel passivating effect by the passivation agent appears as increasing the flow rate of the passivating agent (e.g., $CH_4$ flow rate 25-30 sccm or greater). In this regime, the mandrel height is well preserved. On the other hand, the spacer etch amount increases moderately as increasing the flow rate of the passivating agent. This result demonstrates the passivating ability of a hydrocarbon to the amorphous silicon-based mandrels without a negative impact on the spacer etch rate, and the importance of gas flow rate in relation to the etchant (e.g., $Cl_2$).

FIGS. 3A-3C illustrate process flow charts of methods of self-aligned double patterning (SADP) in accordance with various embodiments. The process flow can be followed with the figures (FIGS. 1A-1G) discussed above and hence will not be described again.

In FIG. 3A, a process flow 30 starts with forming a mandrel over a substrate comprising an underlying layer (block 310, FIG. 1*i*), followed by conformally depositing a spacer material over the substrate, where the spacer material covers top surface and the sidewalls of the mandrel and a portion of the underlying layer (block 320, FIG. 1C). Subsequently, a spacer etch process may be performed by exposing the substrate to a plasma generated from a process gas comprising a first halogen, a second halogen, and a passivating agent comprising carbon (block 330, FIG. 1D). During the spacer etch process, a top portion of the spacer material covering the top surface of the mandrel is removed and the top surface of the mandrel becomes exposed, and a polymeric layer comprising carbon is selectively deposited over the exposed top surface of the mandrel. Still during the spacer etch process, the polymeric layer protects the mandrel from etching, and a bottom portion of the spacer material covering the portion of the underlying layer may be removed and the portion of the underlying layer becomes exposed. The mandrel may then be removed to form free-standing spacers from sidewall portions of the spacer material covering the sidewalls of the mandrel (block 340, FIG. 1E).

In FIG. 3B, another process flow 32 starts with forming a to-be-patterned layer over a substrate (block 302), followed by depositing a mandrel material over the to-be-patterned layer (block 308, FIG. 1A) and patterning the mandrel material to form a mandrel (block 312, FIG. 1). Subsequently, an atomic layer deposition (ALD) may be performed to conformally deposit a spacer material over the substrate to cover a top surface and sidewalls of the mandrel and a portion of to-be-patterned layer (block 322, FIG. 1C). Next, in a plasma etch chamber without a remote plasma source, a process gas comprising a halogen-containing gas and a hydrocarbon may be flowed at a flow rate ratio of the halogen-containing gas and the hydrocarbon of between 3:2 and 10:1 (block 326), a plasma may be generated from the process gas and sustained (block 328), and the substrate may be exposed to the plasma to anisotropically etch the spacer material, wherein a polymeric layer comprising carbon is selectively deposited over the top surface of the mandrel to protect the mandrel from etching (block 332, FIG. 1D). The mandrel may then be removed to form free-standing spacers (block 342, FIG. 1E), followed by patterning the to-be-patterned layer to form a feature using the free-standing spacers as an etch mask (block 352, FIGS. 1F-1G).

In FIG. 3C, yet another process flow 34 starts with performing an extreme ultraviolet (EUV) lithographic process to pattern a photoresist layer formed over a layer stack comprising a mandrel layer, a dielectric layer, and an anti-reflective coating (ARC) layer over a substrate (block 304, FIG. 1A), followed by performing a pattern transfer etch to etch through the dielectric layer and the ARC layer and patterning the mandrel layer (block 314, FIG. 1). Subsequently, a spacer material may be deposited over the patterned mandrel layer and a portion of an underlying layer disposed below the mandrel layer (block 324, FIG. 1C). Next, a first portion of the deposited spacer material that covers top surfaces of the patterned mandrel layer may be removed (block 334, FIG. 1D), a polymeric layer may be formed over the top surfaces of the patterned mandrel layer (block 335, FIG. 1D), and a second portion of the deposited spacer material that covers the portion of the underlying layer may be removed (block 336, FIG. 1D). These three steps may be all achieved in a single plasma etch process by a plasma process using halogen and a passivating agent. The patterned mandrel layer and the polymeric layer may then be removed to form free-standing sidewall spacers (block 344, FIG. 1E), followed by forming a recess in the underlying layer by etching the underlying layer using the free-standing sidewall spacers as an etch mask (block 354, FIGS. 1F-1G).

Figure 4:
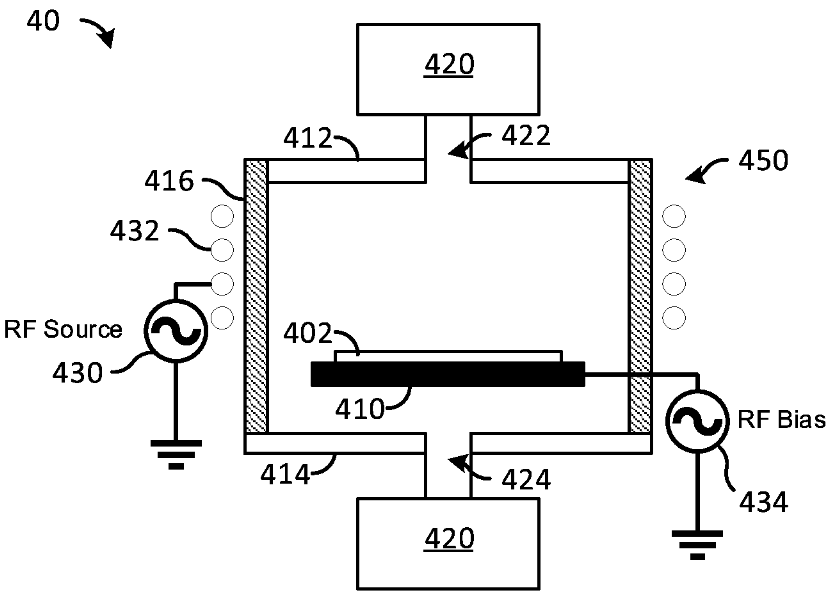
FIG. 4 illustrates a cross-sectional view of a high density plasma (HDP) system for performing a plasma etch process in accordance with various embodiments.

FIG. 4 illustrates a cross-sectional view of a high density plasma (HDP) system for performing a plasma etch process in accordance with various embodiments.

FIG. 4 illustrates a plasma system 40 for performing a plasma etch process with mandrel passivation using an inductively couple plasma (ICP), for example illustrated in the flow diagram in FIGS. 3A-3C. The plasma system 40 has a plasma processing chamber 450 configured to sustain plasma directly above a substrate 402 loaded onto a substrate holder 410. A process gas may be introduced to the plasma processing chamber 450 through a gas inlet 422 and may be pumped out of the plasma processing chamber 450 through a gas outlet 424. The gas inlet 422 and the gas outlet 424 may comprise a set of multiple gas inlets and gas outlets, respectively. The gas flow rates and chamber pressure may be controlled by a gas flow control system 420 coupled to the gas inlet 422 and the gas outlet 424. The gas flow control system 420 may comprise various components such as high pressure gas canisters, valves (e.g., throttle valves), pressure sensors, gas flow sensors, vacuum pumps, pipes, and electronically programmable controllers. An RF bias power source 434 and an RF source power source 430 may be coupled to respective electrodes of the plasma processing chamber 450. The substrate holder 410 may also be the electrode coupled to the RF bias power source 434. The RF source power source 430 is shown coupled to a helical electrode 432 coiled around a dielectric sidewall 416. In FIG. 4, the gas inlet 422 is an opening in a top plate 412 and the gas outlet 424 is an opening in a bottom plate 414. The top plate 412 and bottom plate 414 may be conductive and electrically connected to the system ground (a reference potential).

The plasma system 40 is by example only. In various alternative embodiments, the plasma system 40 may be configured to sustain inductively coupled plasma (ICP) with RF source power coupled to a planar coil over a top dielectric cover, electron cyclotron resonance (ECR) plasma, or capacitively coupled plasma (CCP) sustained using a disc-shaped top electrode in the plasma processing chamber 450. In certain embodiments, design and configuration may be selected (e.g., ICP or ECR) to enable a plasma having a greater plasma density than a common CCP plasma system. Gas inlets and outlets may be coupled to sidewalls of the plasma processing chamber, and pulsed RF power sources and pulsed DC power sources may also be used in some embodiments.

Example embodiments of the invention are summarized here. Other embodiments can also be understood from the entirety of the specification as well as the claims filed herein.

Example 1. A method for processing a substrate includes: forming a mandrel over the substrate including an underlying layer, the mandrel having a top surface and sidewalls, the substrate including an exposed surface including a portion of the underlying layer; conformally depositing a spacer material over the substrate, the spacer material covering the top surface and the sidewalls of the mandrel and the portion of the underlying layer; in a plasma processing chamber, exposing the substrate to a plasma generated in the plasma processing chamber from a first halogen-containing process gas, a second halogen-containing process gas, and a carbon-containing passivating agent, the exposing anisotropically etching the spacer material; and removing the mandrel to form free-standing spacers from sidewall portions of the spacer material covering the sidewalls of the mandrel.

Example 2. The method of example 1, where, the exposing includes removing a top portion of the spacer material covering the top surface of the mandrel to expose the top surface of the mandrel, depositing a polymeric layer including carbon selectively over the exposed top surface of the mandrel, and removing a bottom portion of the spacer material covering the portion of the underlying layer, the polymeric layer protecting the mandrel from being removed.

Example 3. The method of one of examples 1 or 2, where forming the mandrel includes; depositing a mandrel material over a substrate; and patterning the mandrel material using an extreme ultraviolet (EUV) lithography process and an etch process.

Example 4. The method of one of examples 1 to 3, where the plasma processing chamber includes a high-density plasma (HDP) chamber without a remote plasma source.

Example 5. The method of one of examples 1 to 4, where the mandrel includes amorphous silicon.

Example 6. The method of one of examples 1 to 5, where the spacer material includes a titanium oxide.

Example 7. The method of one of examples 1 to 6, where the process gas includes Cl2, a fluorine-containing gas, and the passivating agent includes a hydrocarbon.

Example 8. The method of one of examples 1 to 7, where the process gas includes CF4 or NF3.

Example 9. The method of one of examples 1 to 8, where the passivating agent includes CH4.

Example 10. The method of one of examples 1 to 9, where the process gas includes a chlorine-containing gas and a fluorine-containing gas, a flow rate ratio of the chlorine-containing gas to the fluorine-containing gas being between 5:1 and 20:1.

Example 11. The method of one of examples 1 to 10, where the process gas includes a chlorine-containing gas, a flow rate ratio of the chlorine-containing gas to the passivating agent being between 3:2 and 10:1.

Example 12. The method of one of examples 1 to 11, where the exposure to the plasma during the spacer etch process is between 1 s and 60 s.

Example 13. A method of self-aligned multiple patterning includes: forming a to-be-patterned layer over a substrate; depositing a mandrel material over the to-be-patterned layer; patterning the mandrel material to form a mandrel; performing an atomic layer deposition (ALD) to conformally deposit a spacer material over the substrate, the spacer material covering a top surface and sidewalls of the mandrel and a portion of to-be-patterned layer; in a plasma etch chamber without a remote plasma source, flowing a process gas, the process gas including a halogen-containing gas and a hydrocarbon, a flow rate ratio of the halogen-containing gas and the hydrocarbon being between 3:2 and 10:1; in the plasma etch chamber, sustaining a plasma generated from the process gas; exposing the substrate to the plasma to anisotropically etch the spacer material, where a polymeric layer including carbon is selectively deposited over the top surface of the mandrel, the polymeric layer protecting the mandrel from etching, a portion of the spacer material remaining on the sidewalls of the mandrel; in the plasma etch chamber, removing the mandrel to form free-standing spacers; and using the free-standing spacers as an etch mask, patterning the to-be-patterned layer to form a feature.

Example 14. The method of example 13, the halogen-containing gas includes a mixture of a chlorine-containing gas and a fluorine-containing gas.

Example 15. The method of one of examples 13 or 14, where the flowing further includes flowing a noble gas into the plasma etch chamber.

Example 16. The method of one of examples 13 to 15, where a flow rate of the hydrocarbon is between 4% and 40% of a total gas flow flowed to the plasma etch chamber.

Example 17. A method of self-aligned multiple patterning includes: performing an extreme ultraviolet (EUV) lithographic process to pattern a photoresist layer formed over a layer stack including a mandrel layer, a dielectric layer, and an anti-reflective coating (ARC) layer over a substrate, the substrate further including, below the mandrel layer, an underlying layer; performing a pattern transfer etch to etch through the dielectric layer and the ARC layer and patterning the mandrel layer, a portion of the underlying layer becoming exposed; depositing a spacer material over the patterned mandrel layer and the portion of the underlying layer; removing a first portion of the deposited spacer material that covers top surfaces of the patterned mandrel layer; depositing a polymeric layer over the top surfaces of the patterned mandrel layer; removing a second portion of the deposited spacer material that covers the portion of the underlying layer; removing the patterned mandrel layer and the polymeric layer to form free-standing sidewall spacers; and forming a recess in the underlying layer by etching the underlying layer using the free-standing sidewall spacers as an etch mask.

Example 18. The method of example 17, where removing the first portion of the deposited spacer material, depositing the polymeric layer, and removing the second portion of the deposited spacer material are achieved in a single plasma etch process, the single plasma etch process including exposing the substrate to a plasma generated from a process gas, the process gas including a first halogen, a second halogen, and a passivating agent including carbon.

Example 19. The method of one of examples 17 or 18, where an initial height of the mandrel before the single plasma etch process is at least 20 nm, and a height of the mandrel after the single plasma etch process is at least 70% of the initial height.

Example 20. The method of one of examples 17 to 19, where the recesses have critical dimensions less than a resolution limit of the EUV lithographic process.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for processing a substrate, the method comprising:

forming a mandrel over the substrate comprising an underlying layer, the mandrel having a top surface and sidewalls, the substrate including an exposed surface comprising a portion of the underlying layer;

conformally depositing a spacer material over the substrate, the spacer material covering the top surface and the sidewalls of the mandrel and the portion of the underlying layer;

in a plasma processing chamber, exposing the substrate to a plasma generated in the plasma processing chamber from a first halogen-containing process gas, a second halogen-containing process gas, and a carbon-containing passivating agent, the exposing anisotropically etching the spacer material; and removing the mandrel to form free-standing spacers from sidewall portions of the spacer material covering the sidewalls of the mandrel.

2. The method of claim 1, wherein the exposing comprises:

removing a top portion of the spacer material covering the top surface of the mandrel to expose the top surface of the mandrel, depositing a polymeric layer comprising carbon selectively over the exposed top surface of the mandrel, and removing a bottom portion of the spacer material covering the portion of the underlying layer, the polymeric layer protecting the mandrel from being removed.

3. The method of claim 1, wherein forming the mandrel comprises:

depositing a mandrel material over the substrate; and patterning the mandrel material using an extreme ultraviolet (EUV) lithography process and an etch process.

4. The method of claim 1, wherein the plasma processing chamber comprises a high-density plasma (HDP) chamber without a remote plasma source.

5. The method of claim 1, wherein the mandrel comprises amorphous silicon.

6. The method of claim 1, wherein the spacer material comprises a titanium oxide.

7. The method of claim 1, wherein the first halogen-containing process gas and the second halogen-containing process gas comprise $Cl_2$, a fluorine-containing gas, and the passivating agent comprises a hydrocarbon.

8. The method of claim 1, wherein the first halogen-containing process gas and the second halogen-containing process gas comprise $CF_4$ or $NF_3$.

9. The method of claim 1, wherein the passivating agent comprises $CH_4$.

10. The method of claim 1, wherein the first halogen-containing process gas and the second halogen-containing process gas comprise a chlorine-containing gas and a fluorine-containing gas, a flow rate ratio of the chlorine-containing gas to the fluorine-containing gas being between 5:1 and 20:1.

11. The method of claim 1, wherein the first halogen-containing process gas and the second halogen-containing process gas comprise a chlorine-containing gas, a flow rate ratio of the chlorine-containing gas to the passivating agent being between 3:2 and 10:1.

12. The method of claim 1, wherein the exposing to the plasma during the etching of the spacer material is between 1 s and 60 s.

13. A method of self-aligned multiple patterning comprising:
forming a to-be-patterned layer over a substrate;
depositing a mandrel material over the to-be-patterned layer;
patterning the mandrel material to form a mandrel;
performing an atomic layer deposition (ALD) to conformally deposit a spacer material over the substrate, the spacer material covering a top surface and sidewalls of the mandrel and a portion of to-be-patterned layer;
in a plasma etch chamber without a remote plasma source, flowing a process gas, the process gas comprising a halogen-containing gas and a hydrocarbon, a flow rate ratio of the halogen-containing gas and the hydrocarbon being between 3:2 and 10:1;
in the plasma etch chamber, sustaining a plasma generated from the process gas;
exposing the substrate to the plasma to anisotropically etch the spacer material, wherein a polymeric layer comprising carbon is selectively deposited over the top surface of the mandrel, the polymeric layer protecting the mandrel from etching, a portion of the spacer material remaining on the sidewalls of the mandrel;
in the plasma etch chamber, removing the mandrel to form free-standing spacers; and
using the free-standing spacers as an etch mask, patterning the to-be-patterned layer to form a feature.

14. The method of claim 13, wherein the halogen-containing gas comprises a mixture of a chlorine-containing gas and a fluorine-containing gas.

15. The method of claim 13, wherein the flowing further comprises flowing a noble gas into the plasma etch chamber.

16. The method of claim 13, wherein a flow rate of the hydrocarbon is between 4% and 40% of a total gas flow flowed to the plasma etch chamber.

17. A method of self-aligned multiple patterning, the method comprising:
performing an extreme ultraviolet (EUV) lithographic process to pattern a photoresist layer formed over a layer stack comprising a mandrel layer, a dielectric layer, and an anti-reflective coating (ARC) layer over a substrate, the substrate further comprising, below the mandrel layer, an underlying layer;
performing a pattern transfer etch to etch through the dielectric layer and the ARC layer and patterning the mandrel layer, a portion of the underlying layer becoming exposed;
depositing a spacer material over the patterned mandrel layer and the portion of the underlying layer;
removing a first portion of the deposited spacer material that covers top surfaces of the patterned mandrel layer;
depositing a polymeric layer over the top surfaces of the patterned mandrel layer;
while depositing the polymeric layer, removing a second portion of the deposited spacer material that covers the portion of the underlying layer;
removing the patterned mandrel layer and the polymeric layer to form free-standing sidewall spacers; and
forming a recess in the underlying layer by etching the underlying layer using the free-standing sidewall spacers as an etch mask.

18. The method of claim 17, wherein removing the first portion of the deposited spacer material, depositing the polymeric layer, and removing the second portion of the deposited spacer material are achieved in a single plasma etch process, the single plasma etch process comprising exposing the substrate to a plasma generated from a process gas, the process gas comprising a first halogen, a second halogen, and a passivating agent comprising carbon.

19. The method of claim 18, wherein an initial height of the patterned mandrel layer before the single plasma etch process is at least 20 nm, and a height of the patterned mandrel layer after the single plasma etch process is at least 70% of the initial height.

20. The method of claim 17, wherein the recess has critical dimensions less than a resolution limit of the EUV lithographic process.

* * * * *